United States Patent [19]

Iwamura

[11] Patent Number: 4,491,749
[45] Date of Patent: Jan. 1, 1985

[54] THREE-OUTPUT LEVEL LOGIC CIRCUIT

[75] Inventor: Jun Iwamura, Yokohama, Japan

[73] Assignee: Tokyo Shibaura Denki Kabushiki Kaisha, Kawasaki, Japan

[21] Appl. No.: 477,897

[22] Filed: Mar. 23, 1983

[30] Foreign Application Priority Data

Mar. 26, 1982 [JP] Japan .................... 57-48570

[51] Int. Cl.$^3$ .......................... H03K 19/082
[52] U.S. Cl. ................... 307/473; 307/451; 307/270
[58] Field of Search ........... 307/448, 451, 452, 453, 307/470, 473, 474, 270, 584, 585

[56] References Cited

U.S. PATENT DOCUMENTS

| 3,602,733 | 8/1971 | Aoki | 307/209 |
| 3,651,342 | 3/1972 | Dingwall | 307/451 X |
| 4,037,114 | 7/1977 | Stewart et al. | 307/473 |
| 4,350,906 | 9/1982 | Gillberg | 307/473 X |
| 4,363,978 | 12/1982 | Heimbigner | 307/473 X |
| 4,417,162 | 11/1983 | Keller et al. | 307/473 |

FOREIGN PATENT DOCUMENTS

| 2120627 | 9/1976 | Fed. Rep. of Germany . | |
| 2352449 | 12/1977 | France | 307/473 |
| 656 | 1/1980 | Japan | 307/473 |
| 75349 | 6/1980 | Japan | 307/473 |
| 103536 | 8/1981 | Japan | 307/473 |
| 743200 | 8/1980 | U.S.S.R. | 307/473 |

OTHER PUBLICATIONS

Scarpero, Jr. "FET Bidirectional Driver Control Circuit", IBM Tech. Discl. Bull., vol. 16, No. 8, pp. 2442-2443, 1/1974.
"Application Technique of CMOS" Y. Suzuki; published by Sanpo on Nov. 30, 1976, pp. 66-68.
Pat. Abstract of Japan E-71, Aug. 25, 1981, vol. 5, No. 133.
Pat. Abstract of Japan E-114, May 31, 1979, vol. 3, No. 64.
Pat. Abstract of Japan E-81, Nov. 12, 1981, vol. 5, No. 176.

Primary Examiner—Larry N. Anagnos
Attorney, Agent, or Firm—Finnegan, Henderson, Farabow, Garrett & Dunner

[57] ABSTRACT

A three-output level logic circuit comprises an output stage and a drive stage for driving the output stage. The output stage includes first and second MOS transistors connected in series between first and second power sources and a terminal is provided for producing three-state output signals. The drive stage includes third to sixth MOS transistors connected in series between the first and second power sources. A terminal is provided for supplying a data signal to the fourth and fifth MOS transistors. A control signal is supplied in common to the gate electrodes of the third to sixth MOS transistors. The conductivity types of the first to sixth MOS transistors are selected to operate the logic circuit with one control signal input and one data signal input.

6 Claims, 7 Drawing Figures

F I G. 7
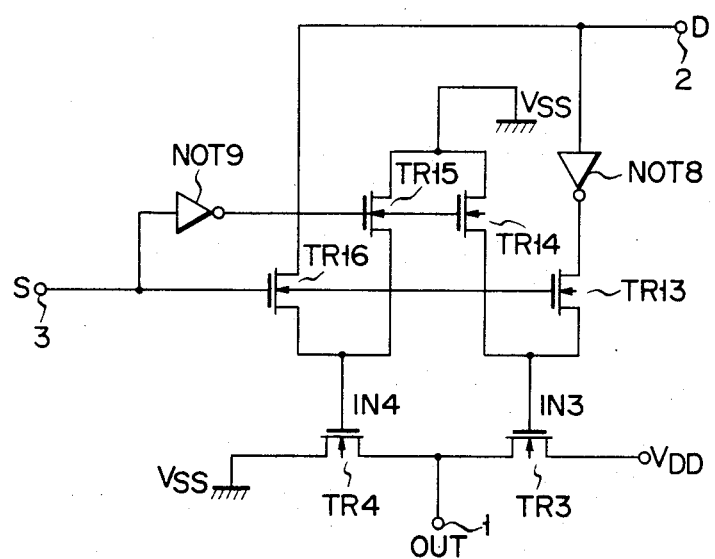

THREE-OUTPUT LEVEL LOGIC CIRCUIT

BACKGROUND OF THE INVENTION

This invention relates to a three-output level logic circuit provided with MOS transistors and more particularly to a type adapted for integration.

A three-output level logic circuit is a type which selectively sends forth a signal having a logic level "1" or "0" or a high impedance output signal. This three-output level logic circuit is indispensable as a drive circuit of a common bus of a central processing unit (CPU).

Description will now be given with reference to FIGS. 1 to 3 of the drawbacks of a conventional three-output level logic circuit. FIG. 1 includes an output stage and a drive stage. The output stage comprises an output terminal 1 for selectively producing a signal having a logic level "1" or "0" or high impedance output signal OUT, a first P type MOS transistor TR1 whose source drain path is connected between the output terminal 1 and a positive voltage source $V_{DD}$, and a second N type MOS transistor TR2 whose source-drain path is connected between the output terminal 1 and a reference voltage source $V_{SS}$ (ground potential). The drive stage for activating the output stage comprises a first NAND circuit NAND1 which is supplied with a data signal D from a data signal supply terminal 2 and a control signal S from a control signal supply terminal 3 and delivers a gate signal IN1 to a gate electrode of the first MOS transistor TR1, and a second NAND circuit NAND2 which receives the data signal D through a first inverter NOT1 and also the control signal S and delivers the output signal thereof through a second inverter NOT2 to a gate electrode of the second MOS transistor TR2 as a gate signal IN2. TABLE 1 below indicates the relationship between the control signal S, data signal D, gate signal IN1, gate signal IN2 and output signal OUT as considered in terms of logic levels.

TABLE 1

| CONTROL SIGNAL S | DATA SIGNAL D | GATE SIGNAL IN1 | GATE SIGNAL IN2 | OUTPUT SIGNAL OUT |
| --- | --- | --- | --- | --- |
| 0 | 1 or 0 | 1 | 0 | Hi-Z |
| 1 | 0 | 1 | 1 | 0 |
| 1 | 1 | 0 | 0 | 1 |

Hi-Z in TABLE 1 above denotes an output of high impedance state.

Referring to FIG. 1, inverters NOT1, NOT2 respectively have two MOS transistors. NAND circuits NAND1, NAND2 are respectively formed of four MOS transistors. Therefore, 14 MOS transistors have to be provided to constitute the logic circuit of FIG. 1. Therefore, the conventional logic circuit of FIG. 1 is accompanied with the drawbacks that the logic circuit occupies a large area; since a large number of gate stages for transmitting a signal are provided, it is difficult to operate the logic circuit at high speed; and involvement of 2-input logic circuits makes it complicated to lay out the logic circuit for integration.

Referring to FIG. 2 indicating another conventional three-output level logic circuit, the output stage has the same arrangement as that of FIG. 1. The drive stage of FIG. 2 comprises a first NOR circuit NOR1 which is supplied with a data signal D and control signal S, and delivers a gate signal IN1 to the gate electrode of the first MOS transistor TR1 through an inverter NOT4, and a second NOR circuit NOR2 which receives the data signal D through an inverter NOT3 and sends forth a gate signal IN2 to the gate electrode of the second MOS transistor TR2. The NOR circuits NOR1, NOR2 respectively have to be provided with four MOS transistors. Therefore, the logic circuit of FIG. 2 needs 14 MOS transistors as does that of FIG. 1, and consequently is accompanied with the same drawbacks as those which occur in FIG. 1. TABLE 2 below indicates the relationships between the data signal D, gate signals IN1, IN2 and output signal OUT as considered in terms of logic levels.

TABLE 2

| CONTROL SIGNAL S | DATA SIGNAL D | GATE SIGNAL IN1 | GATE SIGNAL IN2 | OUTPUT SIGNAL OUT |
| --- | --- | --- | --- | --- |
| 0 | 1 | 1 | 1 | 0 |
| 0 | 0 | 0 | 0 | 1 |
| 1 | 1 or 0 | 1 | 0 | Hi-Z |

The output stage of the conventional three-output level logic circuit of FIG. 3 comprises an MOS transistor TR3 of second conductivity type whose source-drain path is connected between the output terminal 1 and voltage source $V_{DD}$, and an MOS transistor TR4 of second conductivity type whose source-drain path is connected between the output terminal 1 and reference voltage source $V_{SS}$ (ground potential). The drive stage of FIG. 3 comprises a NOR circuit NOR3 which receives a data signal D through an inverter NOT5 and also a control signal S and delivers a gate signal IN3 to the gate electrode of the MOS transistor TR3, and a NOR circuit NOR4 which receives the data signal D and control signal S and sends forth a gate signal IN4 to the gate electrode of the MOS transistor TR4. TABLE 3 below indicates the relationship between the control signal S, gate signals IN3, IN4 and output signal OUT of FIG. 3 as considered in terms of logic levels.

TABLE 3

| CONTROL SIGNAL S | DATA SIGNAL D | GATE SIGNAL IN3 | GATE SIGNAL IN4 | OUTPUT SIGNAL OUT |
| --- | --- | --- | --- | --- |
| 0 | 0 | 0 | 1 | 0 |
| 0 | 1 | 1 | 0 | 1 |
| 1 | 1 or 0 | 0 | 0 | Hi-Z |

The logic circuit of FIG. 3 can indeed be formed of 10 MOS transistors, but still is accompanied with the same problems described with respect to that of FIG. 1.

SUMMARY OF THE INVENTION

It is accordingly the object of this invention to provide a three-output level logic circuit which can be integrated with a small area and performs a high speed operation.

Additional objects and advantages of the invention will be set forth in part in the description which follows, and in part will be obvious from the description, or may be learned by practice of the invention. The objects and advantages of the invention may be realized and attained by means of the instrumentalities and combinations particularly pointed out in the appended claims.

To attain the above-mentioned objects and in accordance with the purpose of the invention, as embodied and broadly described herein, this invention provides a three-output level logic circuit which comprises an output stage including an output terminal for selectively sending forth one of three outputs having different logic levels, a first MOS transistor of first conductivity type whose source-drain path is connected between the output terminal and a first power source, and a second MOS transistor of second conductivity type whose source-drain path is connected between the output terminal and a second power source; a drive stage for driving the output stage; and coupling means for coupling the output stage with the drive stage. The drive stage comprises third and fourth MOS transistors of different conductivity types whose source-drain paths are connected in series between one of the first and second power sources and a data supply terminal, the gate electrodes of the third and fourth MOS transistors being supplied with a common control signal; and fifth and sixth MOS transistors of different conductivity types whose source-drain paths are connected in series between the other of the first and second power sources and the data supply terminal, the gate electrodes of the fifth and sixth MOS transistors being supplied with the common control signal.

The common connection node of the source-drain paths of the third and fourth MOS transistors and the common connection node of the source-drain paths of the fifth and sixth MOS transistors may respectively be connected to the gate electrodes of the first and second MOS transistors either directly or through a noninverting buffer circuit or inverting buffer circuit. A three-output level logic circuit embodying this invention has the advantages that as compared with the conventional type, MOS transistors are used in a smaller number and consequently the logic circuit occupies a smaller area; laying-out for the integration of a logic circuit can be easily performed; and the subject logic circuit can carry out a high speed operation. The accompanying drawings, which are incorporated in and constitute a part of this specification, illustrate embodiments of the invention and, together with the description, serves to explain the principles of the invention.

BRIEF DESCRIPTION OF THE DRAWINGS

FIG. 7 gives the arrangement of a modification of the subject three-output level logic circuit.

DETAILED DESCRIPTION OF THE PREFERRED EMBODIMENTS

Figure 4:
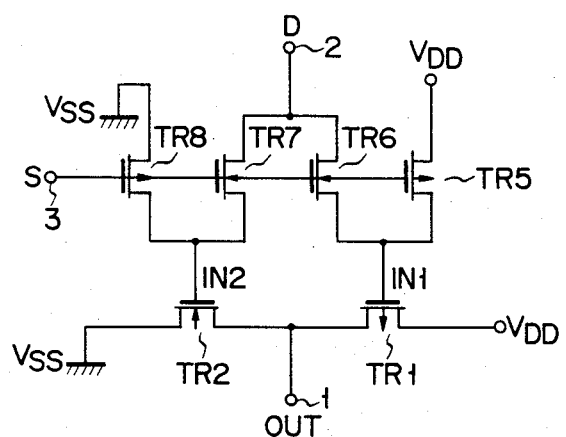
FIG. 4 indicates the arrangement of a three-output level logic circuit constructed according to a first embodiment of this invention.

Now let it be assumed that in FIG. 4 one of three output signals OUT of logic levels "0" and "1" and high impedance Hi-Z is selectively sent forth from an output terminal 1. The source-drain path of a first P type MOS transistor TR1 is connected between the output terminal 1 and power source $V_{DD}$ (corresponding to a logic level "1"). The source-drain path of a second N type MOS transistor TR2 is connected between the output terminal 1 and power source $V_{SS}$ (corresponding to a logic level "0" and having a ground potential level).

The source-drain path of a third P type MOS transistor TR5 is connected between the gate electrode of the first MOS transistor TR1 and power source $V_{DD}$. The source-drain path of a fourth N type MOS transistor TR6 is connected between the gate electrode of the first MOS transistor TR1 and data supply terminal 2. A gate signal IN1 is supplied to the gate electrode of the first MOS transistor TR1. The source-drain path of the fifth N type MOS transistor TR7 is connected between the gate electrode of the second MOS transistor TR2 and data supply terminal 2. The source-drain path of the sixth P type MOS transistor TR8 is connected between the gate electrode of the second MOS transistor TR2 and power source $V_{SS}$. The gate electrodes of the MOS transistors TR5, TR6, TR7 and TR8 are supplied with a common control signal S. A gate signal IN2 is supplied to the gate electrode of the MOS transistor TR2.

When, in FIG. 4, the common control signal S has a logic level "0", the third and sixth MOS transistors TR5, TR8 are rendered conducting, and the fourth and fifth MOS transistors TR6, TR7 are rendered nonconducting. Since a gate signal IN1 to be delivered to the first MOS transistor TR1 has the level of the power source $V_{DD}$, that is, a logic level "1", the first MOS transistor TR1 is rendered nonconducting. Since a gate signal IN2 to be delivered to the second MOS transistor TR2 has the level of the power source $V_{SS}$, that is, a logic level "0", the second MOS transistor TR2 is also rendered nonconducting. Therefore, an output signal OUT is set at a high impedance state Hi-Z. In this case, the data signal D may have a logic level "1" or "0". When the common control signal S has a logic level "1", the third MOS transistor TR5 and sixth MOS transistor TR8 are rendered nonconducting, and the fourth MOS transistor TR6 and fifth MOS transistor TR7 are rendered conducting. When, therefore, the data signal D has a logic level "0", the first MOS transistor TR1 is rendered conducting, and the second MOS transistor TR2 is rendered nonconducting, causing an output signal OUT to have a logic level "1". When the data signal D has a logic level "1", the first MOS transistor TR1 is rendered nonconducting, and the second MOS transistor TR2 is rendered conducting, causing the output signal OUT to have a logic level "0". TABLE 4 below indicates the relationship between the control signal S, data signal D, gate signals IN1, IN2 and output signal OUT, as considered in terms of logic levels.

TABLE 4

| CONTROL SIGNAL S | DATA SIGNAL D | GATE SIGNAL IN1 | GATE SIGNAL IN2 | OUTPUT SIGNAL OUT |
|---|---|---|---|---|
| 0 | 1 or 0 | 1 | 0 | Hi-Z |
| 1 | 0 | 0 | 0 | 1 |
| 1 | 1 | 1 | 1 | 0 |

Figure 5:
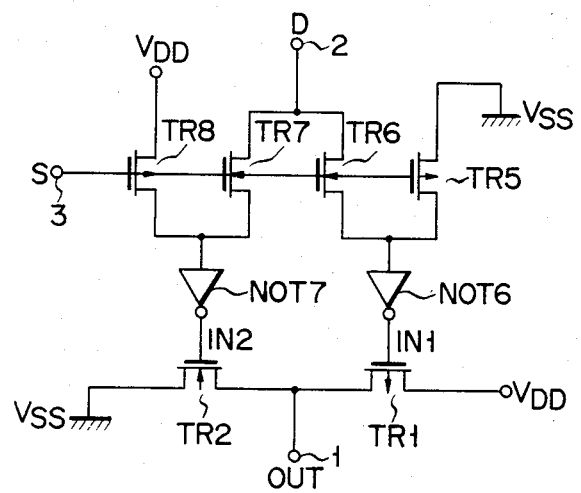
FIG. 5 sets forth the arrangement of a three-output level logic circuit constructed according to a second embodiment of the invention.

When a three-output level logic circuit embodying this invention is utilized, the output stage thereof comprising the first and second MOS transistors TR1, TR2 often drives a large load (not shown). In such case, the first and second MOS transistors TR1, TR2 are chosen to have a large channel width. FIG. 5 illustrates a three-output level logic circuit adapted for the above-mentioned case. In FIG. 5, the drive stage including the third to sixth MOS transistors TR5 to TR8 is coupled with the output stage through the buffer circuits NOT6, NOT7. The output stage of FIG. 5 has exactly the same arrangement as that of FIG. 4. The drive stage of FIG.

5 has substantially the same arrangement as that of FIG. 4, except that the source-drain path of the third MOS transistor TR5 is connected at one end of the power source $V_{SS}$, and the source-drain path of the sixth MOS transistor TR8 is connected at one end of the power source $V_{DD}$. Referring to FIG. 5, the common connection node between the source-drain paths of the third and fourth MOS transistors TR5, TR6 is connected to the gate electrode of the first MOS transistor TR1 through the inverting buffer circuit NOT6. The common connection node between the source-drain paths of the fifth and sixth MOS transistors TR7, TR8 is connected to the gate electrode of the second MOS transistor TR2 through the inverting buffer circuit NOT7. TABLE 5 below shows the relationship between the control signal S, data signal D, gate signals IN1, IN2 and output signal OUT as considered in terms of logic levels, the description of the subject three-output level logic circuit being omitted.

TABLE 5

| CONTROL SIGNAL S | DATA SIGNAL D | GATE SIGNAL IN1 | GATE SIGNAL IN2 | OUTPUT SIGNAL OUT |
|---|---|---|---|---|
| 0 | 1 or 0 | 1 | 0 | Hi-Z |
| 1 | 0 | 1 | 1 | 0 |
|   | 1 | 0 | 0 | 1 |

As seen from TABLE 5 above, the output signal OUT is chosen to have the same logic level as the data signal D. Provision of an odd number of inverting buffer circuits has the same effect as the application of inverting buffer means. In such case, the logic level of the data signal D coincides with that of the output signal OUT. Conversely, provision of an even number of inverting buffer circuits has the same effect as the application of noninverting buffer means. In such a case, the data signal D and output signal OUT have the opposite logic levels.

Description will now be given with reference to FIG. 6 of a three-output level logic circuit, wherein, when a control signal S has a logic level "1", the output signal OUT is set at a high level output state Hi-Z. In the embodiment of FIG. 4, the third, fourth, fifth and sixth MOS transistors TR5, TR6, TR7, TR8 are respectively chosen to be P, N, N and P types, whereas in the embodiment of FIG. 6, the third, fourth, fifth and sixth MOS transistors TR9, TR10, TR11, TR12 are respectively chosen to have N, P, P and N types. TABLE 6 below indicates the relationship between the control signal S, data signal D, gate signals IN1, IN2 and output signal OUT as considered in terms of logic levels, description of the operation of the subject three-output level logic circuit being omitted.

TABLE 6

| CONTROL SIGNAL S | DATA SIGNAL D | GATE SIGNAL IN1 | GATE SIGNAL IN2 | OUTPUT SIGNAL OUT |
|---|---|---|---|---|
| 0 | 0 | 0 | 0 | 1 |
|   | 1 | 1 | 1 | 0 |
| 1 | 1 or 0 | 1 | 0 | Hi-Z |

Figure 6:
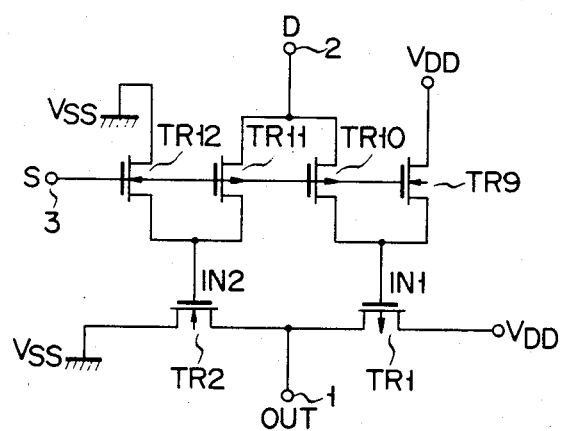
FIG. 6 shows the arrangement of a three-output level logic circuit constructed according to a third embodiment of the invention.

In the embodiment of FIG. 6, it is possible to couple the drive stage with the output stage through buffer circuit means as in the embodiment of FIG. 5.

Figure 1:
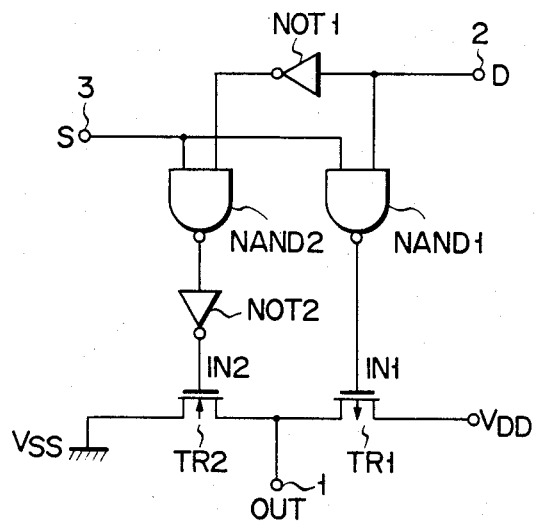
FIGS. 1, 2 and 3 show the arrangements of the conventional three-output level logic circuits.
Figure 2:
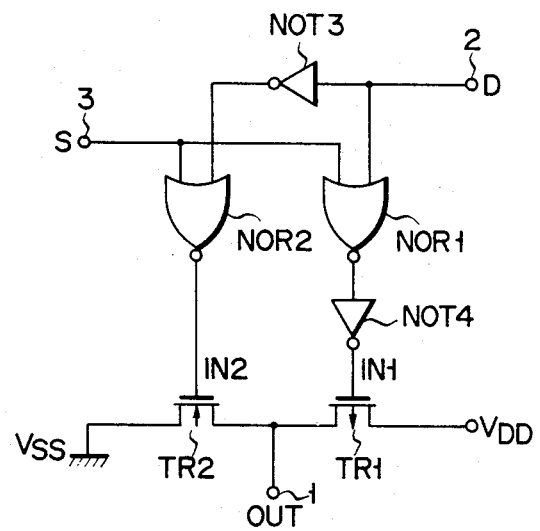
Figure 3:
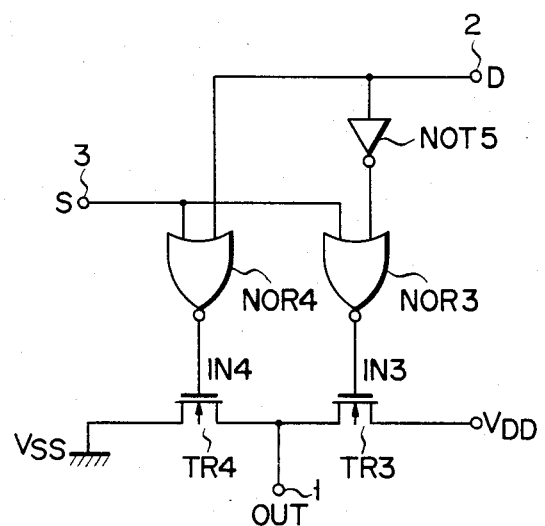

The conventional three-output level logic circuits shown in FIGS. 1, 2 and 3 include a drive stage which is formed of multi-input logic gate means and at least 2-stage logic gate means, and involves a large number of MOS transistors. Therefore, the conventional logic circuit has the drawbacks that laying-out for the integration of a three-output level logic circuit is complicated, and the logic circuit has to be integrated with a large area, thereby presenting difficulties in operating the logic circuit at high speed. In contrast, the three-output level logic circuit of this invention has the advantages that the drive stage thereof includes no multi-input logic gate and can drive the output stage by means of a single stage gate circuit. The three-output logic circuit of this invention includes a smaller number of MOS transistors compared with a conventional one, thereby facilitating the laying-out and allowing for the integration of the subject logic circuit over a reduced area and the operation thereof to be fast.

Description will now be given with reference to FIG. 7 of a modification of the subject three-output level logic circuit. This modification comprises only N type MOS transistors and lacks a multi-input logic gate circuit. The output stage of FIG. 7 comprises a first N type MOS transistor TR3 whose source-drain path is connected between the output terminal 1 and power source $V_{DD}$ and whose gate electrode is supplied with a gate signal IN3 and a second N type MOS transistor TR4 whose source-drain path is connected between the output terminal 1 and power source $V_{SS}$ and whose gate electrode is supplied with a gate signal IN4. The drive stage of FIG. 7 comprises a third N type MOS transistor TR13 whose source-drain path is connected between the data supply terminal 2 and the gate electrode of the first MOS transistor TR3 through an inverter NOT8; a fourth N type MOS transistor TR14 whose source-drain path is connected between the power source $V_{SS}$ and the gate electrode of the first MOS transistor TR3; a fifth MOS transistor TR15 whose source-drain path is connected between the power source $V_{SS}$ and the gate electrode of the second MOS transistor TR4; and a sixth MOS transistor TR16 whose source-drain path is connected between the data supply terminal 2 and the gate electrode of the second MOS transistor TR4. A control signal S is directly supplied to the gate electrodes of the third and sixth MOS transistors TR13, TR16. The control signal S is also supplied to the gate electrodes of the fourth and fifth MOS transistors TR14, TR15 through an inverter NOT9.

When the control signal S has a logic level "0", the MOS transistors TR13, TR16 are rendered nonconducting, and the MOS transistors TR14, TR15 are rendered conducting, causing the gate signals IN3, IN4 to have a logic level "0". As a result, the MOS transistors TR3, TR4 are rendered nonconducting, thereby causing the output signal OUT to be set at a high impedance state Hi-Z. When the control signal S has a logic level "1", the transistors TR13, TR16 are rendered conducting and the MOS transistors TR14, TR15 are rendered nonconducting, causing the gate electrode of the MOS transistor TR4 to be supplied with a data signal D. When the data signal D has a logic level "0", the MOS transistor TR3 is rendered conducting and the MOS transistor TR4 is rendered nonconducting, causing the output signal OUT to have a logic level "1". When the data signal D has a logic level "1", the MOS transistor TR3 is rendered nonconducting and the MOS transistor TR4 is rendered conducting, causing the output signal OUT to have a logic level "0". TABLE 7 below shows the relationship between the control signal S, data signal D, gate signals IN3, IN4 and output signal OUT, as considered in terms of logic levels.

TABLE 7

| CONTROL SIGNAL S | DATA SIGNAL D | GATE SIGNAL IN3 | GATE SIGNAL IN4 | OUTPUT SIGNAL OUT |
|---|---|---|---|---|
| 0 | 1 or 0 | 0 | 0 | Hi-Z |
| 1 | 0 | 1 | 0 | 1 |
| | 1 | 0 | 1 | 0 |

The three-output level logic circuit of FIG. 7 requires ten MOS transistors as does that of FIG. 5. However, the modification shown in FIG. 7 has the advantages that it is unnecessary to provide a multi-input logic gate circuit, thereby facilitating the laying-out for the integration of the three-output level logic circuit and enabling the logic circuit to be integrated with a reduced area. The drive stage can drive the output stage simply by being provided with a single stage logic gate circuit at most and a single stage MOS transistor, assuring the high speed operation of the subject three-output level logic circuit. With the logic circuit of FIG. 7, the gate signals IN3, IN4 may be supplied to the output stage through the corresponding buffer circuits as in FIG. 5. When the buffer circuits are provided in an odd number, the power source $V_{DD}$ has to be connected to a common connection node between the source-drain paths of the MOS transistors TR14, TR15. The same three-output level logic circuit shown in FIG. 7 may also be formed of P type MOS transistors alone.

What is claimed is:

1. A three-output level logic circuit comprising an output stage including an output terminal for selectively sending forth one of three outputs having different logic levels, a first metal oxide semiconductor (MOS) transistor of first conductivity type whose source-drain path is connected between said output terminal and a first power source, and a second MOS transistor of second conductivity type whose source-drain path is connected between said output terminal and a second power source; a drive stage for driving said output stage; and coupling means for coupling said output stage with said drive stage, wherein said drive stage comprises third and fourth MOS transistors of different conductivity types whose source-drain paths are connected in series between one of said first and second power sources and a data supply terminal, the gate electrodes of said third and fourth MOS transistors being supplied with a common control signal; and fifth and sixth MOS transistors of different conductivity types whose source-drain paths are connected in series between the other of said first and second power sources and said data supply terminal, the gate electrodes of said fifth and sixth MOS transistors being supplied with said common control signal.

2. The three-output level logic circuit according to claim 1, wherein said coupling means comprises means for directly connecting the common connecting node between the source-drain paths of said third and fourth MOS transistors to the gate electrode of the first MOS transistor, and also the common connecting node between the source-drain paths of said fifth and sixth MOS transistors to the gate electrode of the second MOS transistor.

3. The three-output level logic circuit according to claim 1, wherein said coupling means comprises inverting buffer means connected between the common connecting node between the source-drain paths of said third and fourth MOS transistors and the gate electrode of said first MOS transistor, and connected between the common connecting node between the source-drain paths of said fifth and sixth MOS transistors and the gate electrode of said second MOS transistor.

4. The three-output level logic circuit according to claim 1, wherein said coupling means comprises noninverting buffer means connected between the common connecting node between the source-drain paths of said third and fourth MOS transistors and the gate electrode of said first MOS transistor, and connected between the common connecting node between the source-drain paths of said fifth and sixth MOS transistors and the gate electrode of said second MOS transistor.

5. The three-output level logic circuit according to claim 1, wherein said third MOS transistor is an MOS transistor of first conductivity type whose source-drain path is connected at one end to one of said first and second power sources; said fourth MOS transistor is an MOS transistor of second conductivity type whose source-drain path is connected at one end to said data supply terminal; said fifth MOS transistor is an MOS transistor of second conductivity type whose source-drain path is connected at one end to said data supply terminal; and said sixth MOS transistor is an MOS transistor of first conductivity type whose source-drain path is connected at one end to the other of said first and second power sources.

6. The three-output level logic circuit according to claim 1, wherein said third MOS transistor is an MOS transistor of second conductivity type whose source-drain path is connected at one end to said first power source; said fourth MOS transistor is an MOS transistor of first conductivity type whose source-drain path is connected at one end to said data supply terminal; said fifth MOS transistor is an MOS transistor of first conductivity type whose source-drain path is connected at one end to said data supply terminal; and said sixth MOS transistor is an MOS transistor of second conductivity type whose source-drain path is connected at one end to said second power source.

* * * * *